(12) United States Patent
Wu

(10) Patent No.: US 8,039,367 B2
(45) Date of Patent: Oct. 18, 2011

(54) SCRIBE LINE STRUCTURE AND METHOD FOR DICING A WAFER

(75) Inventor: Ping-Chang Wu, Hsin-Chu Hsien (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 112 days.

(21) Appl. No.: 12/465,636

(22) Filed: May 13, 2009

(65) Prior Publication Data

US 2010/0289021 A1 Nov. 18, 2010

(51) Int. Cl.
*H01L 21/00* (2006.01)
*H01L 23/58* (2006.01)
*H01L 23/544* (2006.01)

(52) U.S. Cl. ........ 438/462; 438/461; 438/460; 438/463; 438/464; 438/465; 257/48; 257/797; 257/798

(58) Field of Classification Search .......... 438/460–465; 257/48, 797, 798, E23.001, E23.002, E21.521, 257/E21.529

See application file for complete search history.

(56) References Cited

U.S. PATENT DOCUMENTS

| 5,047,711 | A  | * | 9/1991  | Smith et al. ............. 324/750.06 |
| 5,530,280 | A  |   | 6/1996  | White |
| 5,923,047 | A  | * | 7/1999  | Chia et al. ...................... 257/48 |
| 7,057,296 | B2 |   | 6/2006  | Hung |
| 2004/0017217 | A1 | * | 1/2004  | Ryu et al. ...................... 324/763 |
| 2004/0137702 | A1 | * | 7/2004  | Iijima et al. .................. 438/463 |
| 2005/0202650 | A1 | * | 9/2005  | Imori et al. .................. 438/462 |
| 2005/0212092 | A1 | * | 9/2005  | Nishizawa .................... 257/622 |
| 2005/0282360 | A1 | * | 12/2005 | Kida et al. .................... 438/462 |
| 2006/0109014 | A1 | * | 5/2006  | Chao et al. .................... 324/754 |
| 2008/0164468 | A1 | * | 7/2008  | Chen et al. ...................... 257/48 |
| 2010/0133669 | A1 | * | 6/2010  | Jao .................................. 257/669 |

* cited by examiner

Primary Examiner — Michael S Lebentritt
Assistant Examiner — Karen M Kusumakar
(74) Attorney, Agent, or Firm — Winston Hsu; Scott Margo

(57) ABSTRACT

A scribe line structure is disclosed. The scribe line structure includes a semiconductor substrate having a die region, a die seal ring region, disposed outside the die region, a scribe line region disposed outside the die seal ring region and a dicing path formed on the scribe line region. Preferably, the center line of the dicing path is shifted away from the center line of the scribe line region along a first direction.

15 Claims, 3 Drawing Sheets

SCRIBE LINE STRUCTURE AND METHOD FOR DICING A WAFER

BACKGROUND OF THE INVENTION

1. Field of the Invention

The invention relates to a scribe line structure, and more particularly, to a scribe line structure capable of preventing dicing cracks from spreading to adjacent die regions.

2. Description of the Prior Art

The manufacturing flow of the integrated circuit can be mainly distinguish into three stages as follows: (1) the manufacturing of the substrate, (2) the fabrication of the integrated circuit on the substrate, and (3) the cutting, electric testing, sorting, and packaging of the integrated circuit. When fabricating the integrated circuit on the substrate, the whole substrate is divided uniformly into many repetitive dies, and the adjacent dies are separated by scribe line. The cutting step of the integrated circuit utilizes a cutter to cut the substrate into individual dies along the scribe lines.

In recent years, the high integration semiconductor process, with an inter-metal dielectric layer collocated by the dual damascene technology and the use of low dielectric materials, is the most popular metal interconnect technology to date. Due to the low resistance of copper, and the low dielectric material, the RC delay between the metal wires is greatly reduced. However, for achieving low dielectric property, many of low dielectric materials have loose, and weak mechanical strength structures, and are fragile. Therefore a chip crack often occurs from lateral cutting stress while performing wafer dicing. The chip crack damages the die seal ring region of the wafer that protects the die region and induces metal layer delamination. This causes high early failure rate in products, thereby reducing yield in subsequent electric test processes.

SUMMARY OF THE INVENTION

It is an objective of the present invention to provide a scribe line structure for preventing cracks from spreading as wafer is diced. Preferably, the scribe line of the present invention prevents the metal interconnect layer disposed in the dicing region from being diced, which further prevents damage of the adjacent die region.

According to a preferred embodiment of the present invention, a scribe line structure includes a semiconductor substrate having a die region, a die seal ring region disposed outside the die region, a dicing region disposed outside the die seal ring region, and a dicing path formed on the dicing region. Preferably, the center line of the dicing path is shifted away from the center line of the dicing region along a first direction.

According to another aspect of the present invention, a method for dicing a wafer is disclosed. The method includes the steps of: providing a semiconductor substrate having a die region, a die seal ring region, disposed outside the die region, and a dicing region disposed outside the die seal ring region; defining a dicing path on the dicing region, such that the center line of the dicing path is shifted away from the center line of the dicing region along a first direction; and dicing the semiconductor substrate along the dicing path.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
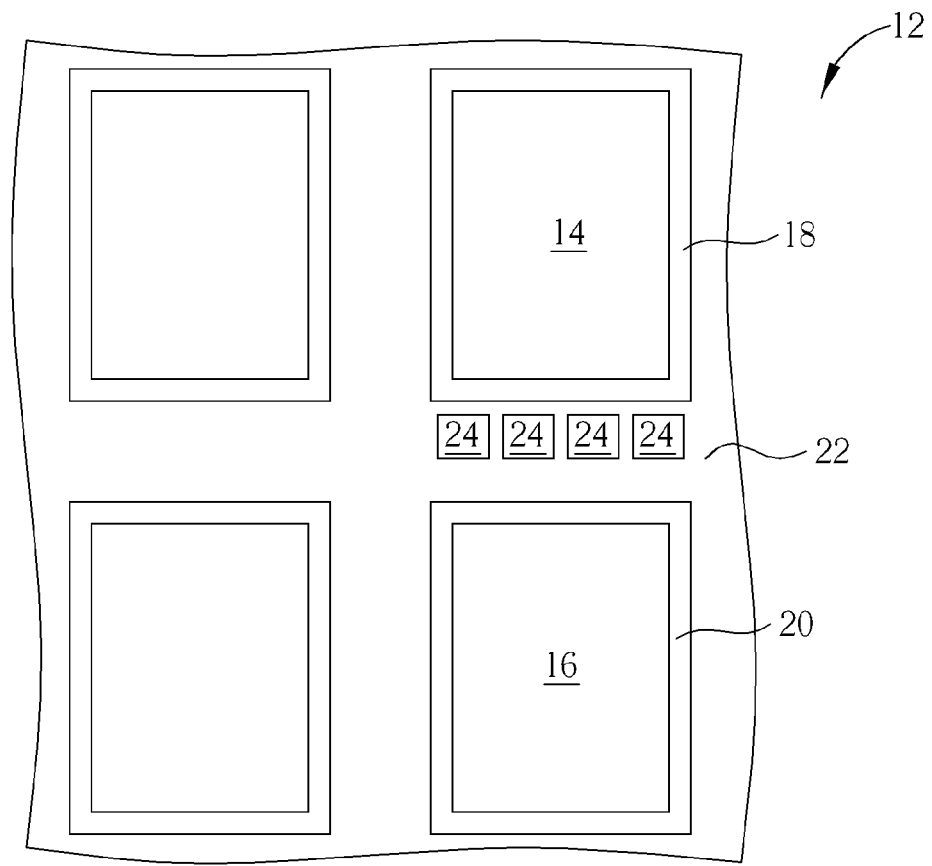
FIG. 1 illustrates a top view of a crack stopping structure according to a preferred embodiment of the present invention.

Referring to FIG. 1, FIG. 1 illustrates a top view of a crack stopping structure according to a preferred embodiment of the present invention. As shown in FIG. 1, a semiconductor substrate 12, such as a silicon wafer is provided. A plurality of die regions 14/16 and die seal ring regions 18/20, and a dicing region 22 are defined on the semiconductor substrate 12. The dicing region 22 is formed on the exterior side of the die regions 14/16 and the die seal ring regions 18/20 and surrounds the entire die seal ring. The die seal ring regions 18/20 are disposed between the die regions 14/16 and the dicing region 22, such that the die seal ring could be used as a blocking wall for protecting the die regions 14/16 from external stress while the wafer is diced. Despite only one single die seal ring region 18/20 surrounding the die regions 14/16 is disclosed in this embodiment, the number of die seal rings 18/20 could be adjusted according to the demand of the fabrication process, which are all within the scope of the present invention. A plurality of wafer acceptance test pads 24 are placed on the dicing region 22 for testing purpose. For illustration purpose, only four pads 24 are shown in FIG. 1 and the pads 22 are preferably diced by dicing tool while the wafer is diced along the dicing region 22.

Figure 2:
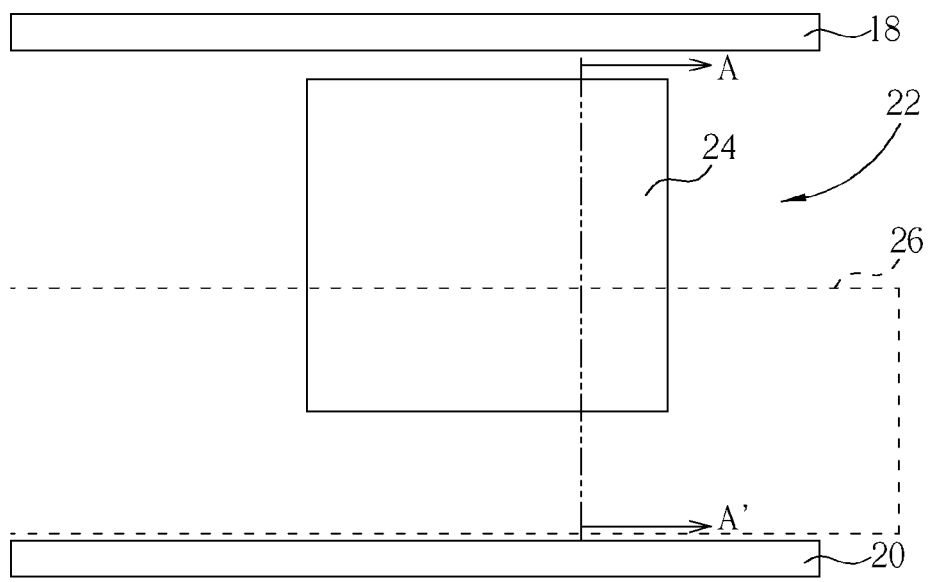
FIG. 2 illustrates an enlarged view of the dicing region between the die seal ring region and the die seal ring region shown in FIG. 1.
Figure 3:
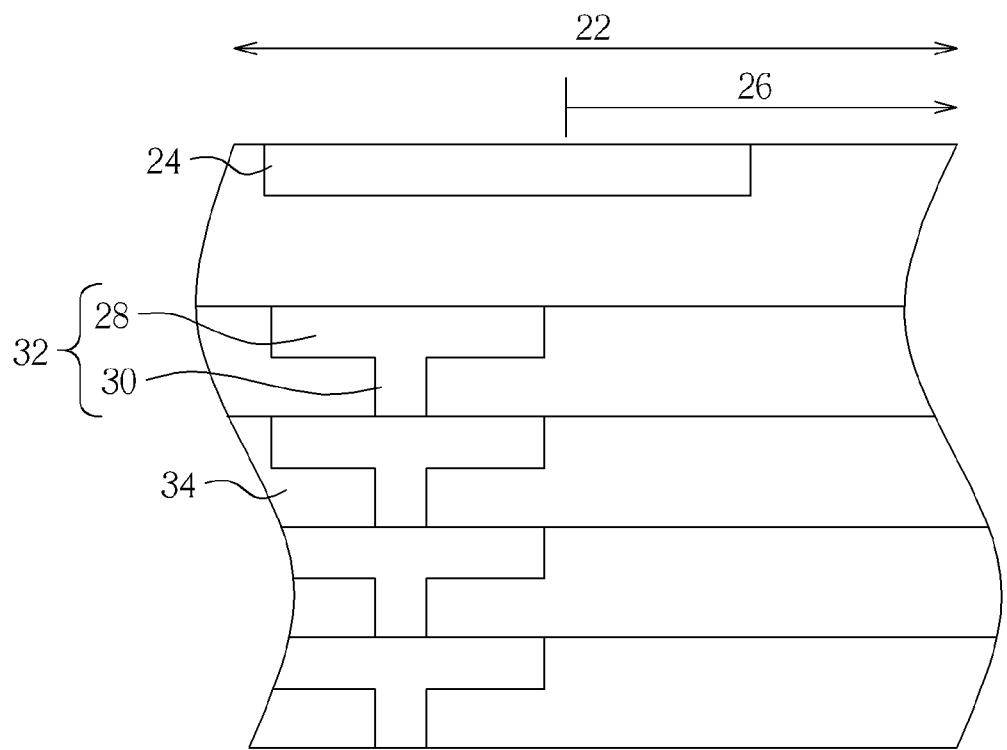
FIG. 3 illustrates a cross-sectional view of FIG. 2 along the sectional line AA'.

Referring to FIGS. 2-3, FIG. 2 illustrates an enlarged view of the dicing region 22 between the die seal ring region 18 and the die seal ring region 20 shown in FIG. 1, and FIG. 3 illustrates a cross-sectional view of FIG. 2 along the sectional line AA'. As shown in FIG. 2, an actual dicing path 26 is defined on the dicing region 22, in which the center line of the dicing path 26 is shifted away from the center line of the dicing region 22 along a direction while the test pads 24 are shifted away from the center line of the dicing region 22 along another direction. According to a preferred embodiment of the present invention, the direction shifted by the dicing path 25 is preferably opposite to the direction shifted by the test pads 24. As revealed by the structure shown in FIG. 2, the dicing path 26 is shifted downward and immediately adjacent to the edge of the die seal ring region 20 while the test pads 24 are shifted upward and immediately adjacent to the edge of the die seal ring region 18.

At least one metal interconnect structure 32 is disposed under the test pads 24 and these two elements could be fabricated along with the MOS transistors and metal interconnects formed in the die regions 14/16. For instance, a standard MOS fabrication could be performed to form plurality of MOS transistors (not shown) including gate electrode, spacer, source/drain region, and silicide layers on the semiconductor substrate 12 of the die regions 14/16. An interlayer dielectric layer (not shown) is then deposited on the transistor of the die regions 14/16 as well as the semiconductor substrate 12 of the die seal ring region 18/20 and the dicing region 22. A metal interconnect fabrication is performed to form a plurality of dielectric layers 34 on the interlayer dielectric layer of the die regions 14/16, the die seal ring regions 18/20, and the dicing region 22 and a plurality of metal interconnect structures 32 composed of patterned metal layer 28 and conductive vias 30 in the dielectric layers 34, as shown in FIG. 3. The metal interconnect structures 32 in the die regions 14/16 are formed to electrically connect the transistor to other external circuits, and the metal interconnect structures 32 in the die seal ring regions 18/20 could be electrically connected to other circuits or only disposed in the dielectric layers 34 for serving as a protective barrier for the die regions 14/16. Thereafter, a plurality of contact pads (not shown) are formed on the dielectric layer of the die regions 14/16 while the test pads 24 are formed on the dielectric layer 34 of the dicing region 22. The test pads 24 could be electrically connected to each wafer acceptance testing (WAT) structure disposed underneath the dicing region 22, and electrical voltages or currents could be applied on the test pads 24 for testing electrical response of the WAT structures. The test pads 24 could also be replaced by monitoring blocks utilized for monitoring the depth of the stacked film or be replaced by alignment marks. Preferably, the test pads 24 could be any structure disposed on the dicing region 22.

In this embodiment, the test pads 24 and the metal interconnect structures 32 are not interconnected. However, a connection could be established between these two elements and a passivation could be disposed on top of the test pads 24 and the entire substrate, and the passivation layer could be patterned to expose a portion of the test pads 24 thereafter, which is also within the scope of the present invention. Preferably, the test pads 24 and the metal interconnect structures 32 are composed of different conductive material. For instance, the test pads 24 in this embodiment is preferably composed of aluminum or alloy thereof, while the patterned metal layer 28 and the conductive vias 30 of the metal interconnect structure 32 are preferably composed of copper.

It should be noted that the dicing path 26 only overlaps a portion of the edge of the test pads 24, as shown in FIG. 2, while not overlapping any of the metal interconnect structure 32 disposed under the test pads 24, as shown in FIG. 3. In other words, as the semiconductor substrate 12 is diced along the dicing path 26 of the dicing region 22, only a portion of the test pads 24 is diced and the metal interconnect structures 32 disposed under the test pads 24 are preferably not diced during the dicing process. Nevertheless, a portion of the metal interconnect structure 32 within the dicing region 22 could also be diced depending on the demand of the fabrication as the semiconductor substrate 12 is diced, which is also within the scope of the present invention. As only a portion of the edge of the test pads 24 is diced and the metal interconnect structures 32 disposed under the test pads 24 are preferably not diced during the dicing process, the present invention could prevent horizontal spreading of dicing cracks caused by dicing of the metal interconnect structure 32, which further prevents damage of the adjacent die seal ring regions 18/20 or die regions 14/16.

Figure 4:
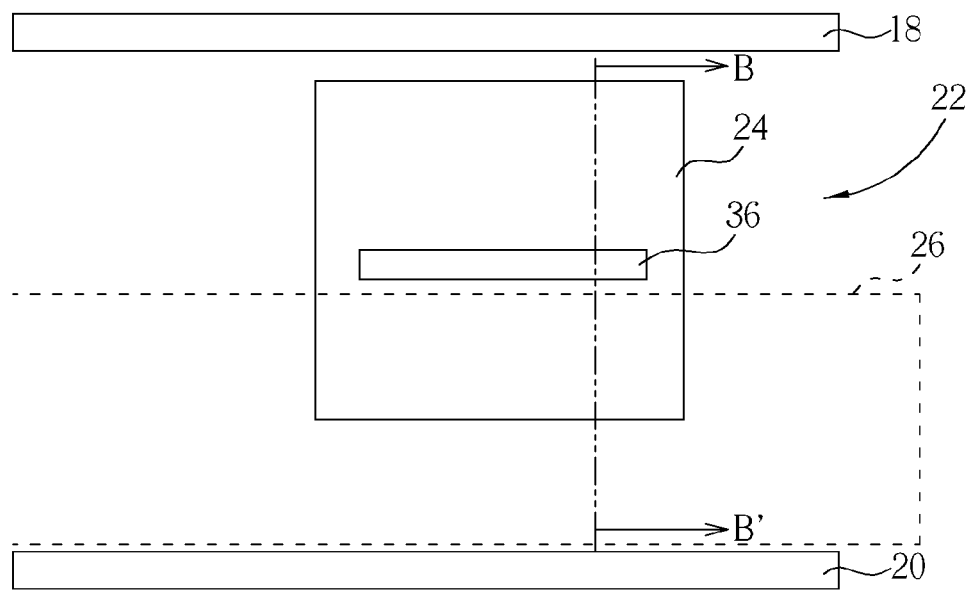
FIG. 4 illustrates an enlarged view of a scribe line structure according to an embodiment of the present invention.
Figure 5:
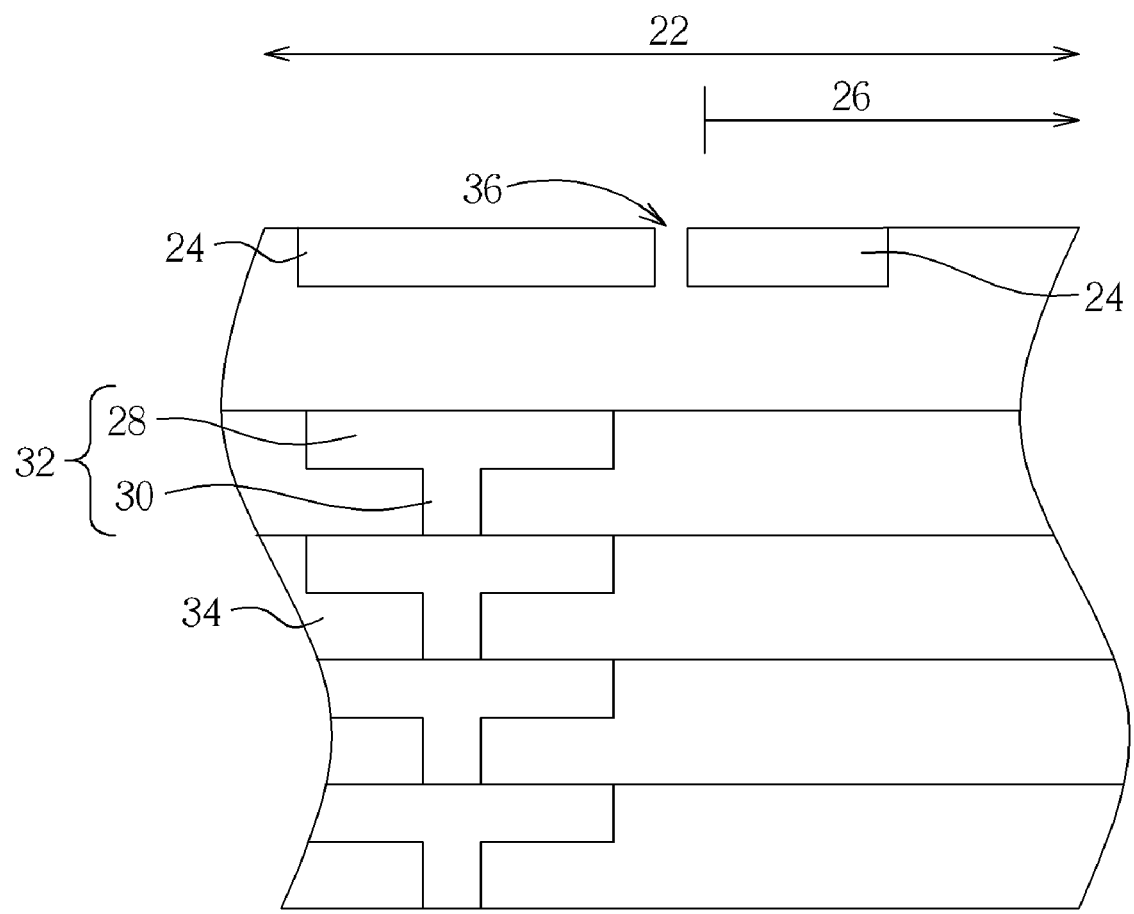
FIG. 5 illustrates a cross-sectional view of FIG. 4 along the sectional line BB'.

Referring to FIGS. 4-5, FIG. 4 illustrates an enlarged view of a scribe line structure according to an embodiment of the present invention, and FIG. 5 illustrates a cross-sectional view of FIG. 4 along the sectional line BB'. As shown in FIG. 4, a dicing path 26 is defined on the dicing region 22, and the center line of the dicing path 26 is shifted downward from the center line of the dicing region 22 while the test pads 24 are shifted upward from the center line of the dicing region 22. Preferably, the direction shifted by the dicing path 26 is opposite to the direction shifted by the test pads 24, and as revealed by the structure shown in FIG. 4, the dicing path 26 is shifted downward and situated immediately adjacent to the edge of the die seal ring region 20 while the test pads 24 are shifted upward and situated immediately adjacent to the edge of the die seal ring region 18.

At least one metal interconnect structure 32 is disposed under the test pads 24, in which the metal interconnect structure 32 and the test pads 24 are preferably composed of different material. For instance, the test pads 24 in this embodiment are preferably composed of aluminum or alloy thereof, and the patterned metal layers 28 and the conductive vias 30 of the metal interconnect structure 32 are preferably composed of copper.

In contrast to the previous embodiment, an opening 36 is formed in the test pads 24 and this opening 36 is preferably formed while the test pad 24 patterns are defined. For instance, a plurality of dielectric layers 34 and metal interconnect structures 32 comprising patterned metal layers 28 and conductive vias 30 embedded in the dielectric layers 34 could be formed by following the aforementioned metal interconnect process. A pad fabrication is conducted thereafter to form a plurality of test pads 24 in the die regions 18/20 and the dicing region 22. In the pad fabrication, etching processes are preferably conducted to pattern the test pads 24 and form the opening 36 simultaneously. In this embodiment, the opening 36 is preferably formed between the dicing path 26 and the metal interconnect structure 32, such that when the semiconductor substrate 12 is diced by the dicing tool, an isolating effect is created by the opening 36 to prevent dicing crack from spreading to the adjacent die seal ring regions 18/20 or even more interior die regions 14/16. Despite only one opening 36 is formed in the test pad 24 according to this embodiment, the quantity and position of the opening 36 could all be adjusted according to the demand of the product, which are all within the scope of the present invention.

Overall, a scribe line structure capable of preventing dicing crack from spreading to adjacent die regions is disclosed. Preferably, at least one wafer acceptance test pads is disposed on the dicing region of the scribe line structure and a dicing path is also defined on the dicing region, in which the center line of the dicing path is shifted away from the center line of the dicing region while the wafer acceptance test pads are shifted away from the center line of the dicing region toward an opposite direction. As only a portion of the edge of the test pads is overlapped by the dicing path and the metal interconnect structure disposed under the test pads are preferably not overlapped by the dicing path, only the edge of the test pads is diced throughout the dicing process while the metal interconnect structure disposed underneath is unaffected. By doing so, horizontal spreading of dicing cracks resulted from the dicing process is prevented effectively.

Those skilled in the art will readily observe that numerous modifications and alterations of the device and method may be made while retaining the teachings of the invention.

What is claimed is:
1. A scribe line structure, comprising:
a semiconductor substrate having a die region, a die seal ring region disposed outside the die region, a dicing region disposed outside the die seal ring region, and a dicing path formed on the dicing region, wherein the dicing region comprises at least one test pad thereon and the dicing path only overlaps a portion of the edge of the test pad, and the center line of the dicing path is shifted away from the center line of the dicing region along a first direction.
2. The scribe line structure of claim 1, wherein the test pad comprises a wafer acceptance test pad.

3. The scribe line structure of claim 1, wherein the test pad comprises aluminum.

4. The scribe line structure of claim 1, wherein the dicing region comprises at least one metal interconnect structure connected to the test pad as the dicing path not overlapping the metal interconnect structure.

5. The scribe line structure of claim 4, wherein the metal interconnect structure comprises copper.

6. The scribe line structure of claim 1, wherein the test pad is shifted away from the center line of the dicing region along a second direction, and the first direction is the opposite direction of the second direction.

7. The scribe line structure of claim 4, further comprising at least one opening formed in the test pad, wherein the opening is situated between the dicing path and the metal interconnect structure.

8. A method for dicing a wafer, comprising:
providing a semiconductor substrate having a die region, a die seal ring region, disposed outside the die region, and a dicing region disposed outside the die seal ring region;
defining a dicing path on the dicing region, such that the center line of the dicing path is shifted away from the center line of the dicing region along a first direction;
forming at least one test pad in the dicing region, wherein the dicing path only overlaps a portion of the edge of the test pad; and
dicing the semiconductor substrate along the dicing path by only dicing the portion of the edge of the test pad.

9. The method of claim 8, wherein the test pad comprises a wafer acceptance test pad.

10. The method of claim 8, wherein the test pad comprises aluminum.

11. The method of claim 8, further comprising forming at least one metal interconnect structure in the dicing region and connecting the metal interconnect structure and the test pad while the dicing path not overlapping the metal interconnect structure.

12. The method of claim 11, wherein the step of dicing the semiconductor substrate along the dicing path comprises not dicing the metal interconnect structure.

13. The method of claim 11, wherein the metal interconnect structure comprises copper.

14. The method of claim 8, wherein the test pad is shifted away from the center line of the dicing region along a second direction, and the first direction is the opposite direction of the second direction.

15. The method of claim 8, further comprising forming at least one opening in the test pad, wherein the opening is situated between the dicing path and the metal interconnect structure.

* * * * *